United States Patent
Sonnenreich et al.

(10) Patent No.: US 6,729,527 B2
(45) Date of Patent: May 4, 2004

(54) BONDING TOOL WITH POLYMER COATING

(75) Inventors: Benjamin Sonnenreich, Haifa (IL); Sigalit Robinzon, Timrat (IL)

(73) Assignee: Kulicke & Soffa Investments, Inc., Wilmington, DE (US)

( * ) Notice: Subject to any disclaimer, the term of this patent is extended or adjusted under 35 U.S.C. 154(b) by 0 days.

(21) Appl. No.: 09/772,421

(22) Filed: Jan. 30, 2001

(65) Prior Publication Data

US 2002/0100790 A1 Aug. 1, 2002

(51) Int. Cl.⁷ ................................................ B23K 37/00
(52) U.S. Cl. ........................................ 228/4.5; 228/44.7
(58) Field of Search ........................ 228/4.5, 1.1, 44.7, 228/3.1

(56) References Cited

U.S. PATENT DOCUMENTS

| 4,513,190 A | * | 4/1985 | Ellett et al. ............... 219/56.21 |
| 4,691,854 A | * | 9/1987 | Haefling et al. ............. 228/4.5 |
| 4,950,365 A |   | 8/1990 | Evans |
| 5,421,503 A |   | 6/1995 | Perlberg et al. |
| 5,558,270 A |   | 9/1996 | Nachon et al. |
| 5,871,141 A |   | 2/1999 | Hadar |
| 5,879,808 A |   | 3/1999 | Wary et al. |
| 5,931,368 A | * | 8/1999 | Hadar et al. ................. 228/4.5 |
| 6,171,456 B1 | * | 1/2001 | Hadar et al. ........... 204/192.15 |

FOREIGN PATENT DOCUMENTS

| GB | 2165178 | 4/1986 |
| JP | 11284014 | 10/1999 |

* cited by examiner

Primary Examiner—Tom Dunn
Assistant Examiner—Len Tran
(74) Attorney, Agent, or Firm—RatnerPrestia

(57) ABSTRACT

A bonding tool for bonding a wire to a substrate. The bonding tool has a body portion, a working tip coupled to one end of the body portion, an orifice extending along a longitudinal axis of the body and the working tip, and a polymer coating disposed over at least a portion of a surface of the orifice.

15 Claims, 7 Drawing Sheets

BONDING TOOL WITH POLYMER COATING

FIELD OF THE INVENTION

This invention generally relates to a bonding tools used for fine wire bonding, and more particularly to a capillary bonding tool having a polymer coating disposed over the surface of the capillary.

BACKGROUND OF THE INVENTION

Wire bonding is, at this time, the dominant method used for the interconnection of semiconductor-based devices. In the wire bonding industry, tool failure leads to the destruction of the semiconductor device being interconnected, which can significantly lower yields. To prevent tool failures, tools are exchanged regularly prior to the predicted time of failure.

The wire bonding process is defined by the "Process Window," which is the range of parameters that the bonding machine is qualified to operate within. To maintain bond quality, adjustments must be made to the bonding parameters. Bonding parameters, however, are not allowed to be outside of the approved process window. This leads to a loss of productivity as the bonding process must be stopped and tools exchanged. Furthermore, additional expense is incurred as a larger number of tools than necessary are used.

Contamination build-up and accelerated wear limit the useable time for conventional ceramic-based tools (e.g. Alumina, Zirconia toughened Alumina, Zirconia, cemented Tungsten Carbide, etc.) in wire bonding applications. Adhesion of organic-derived carbonaceous material and the subsequent embedding in the carbonaceous material of metallic particles from the bonding wire causes unsymmetrical loading of the tool and eventually leads to mechanical failure of the bonding tool by flexural bending. The carbonaceous material is produced by the action of the Electric Flame Off (EFO, for ball formation) on the petroleum and stearate-based materials typically placed on the wire surface to improve de-spooling of the wire. Enhanced surface wear is also caused due to the localization of bonding forces to a point load on the tool face.

U.S. Pat. Nos. 5,871,141, 5,558,270, and 5,421,503 assigned to the same assignee as the present invention, describe various conventional bonding tools for producing wire bonds on semiconductor devices and are incorporated herein by reference.

SUMMARY OF THE INVENTION

In view of the shortcomings of the prior art, the present invention relates to a bonding tool having an orifice extending along a longitudinal axis of the tool body, a working tip coupled to one end of the tool body, and a polymer coating disposed over at least a portion of a surface of the orifice.

The present invention also relates to a method of manufacturing a bonding tool for bonding a fine wire to a substrate, comprising the steps of forming a cylindrical body, forming a taper at a first end of the body, forming an orifice extending along a longitudinal axis of the body, and coating the body with a polymer.

According to another aspect of the present invention, a first coating is disposed along the surface of the orifice and a second coating is disposed along an exterior surface of the bonding tool.

BRIEF DESCRIPTION OF THE DRAWINGS

The invention is best understood from the following detailed description when read in connection with the accompanying drawings. It is emphasized that, according to common practice, the various features of the drawing are not to scale. On the contrary, the dimensions of the various features are arbitrarily expanded or reduced for clarity. Included in the drawing are the following Figures.

DETAILED DESCRIPTION OF THE INVENTION

To overcome the aforementioned deficiencies, a polymer coating, such as parylene is deposited on the surface of a bonding tool. This surface coating is found to reduce the adhesion of contaminants, such as Carbon, Gold, Copper, Chlorine, Calcium, Iron, Sulfur, Beryllium, Oxides, Nitrides, etc., to the surface of the bonding tool, thereby increasing the time to failure and stabilizing the wire bonding process window. It is contemplated that the coating will be used mostly on newly produced bonding tool although the coating may also be applied to previously produced bonding tools if desired.

Figure 1A:
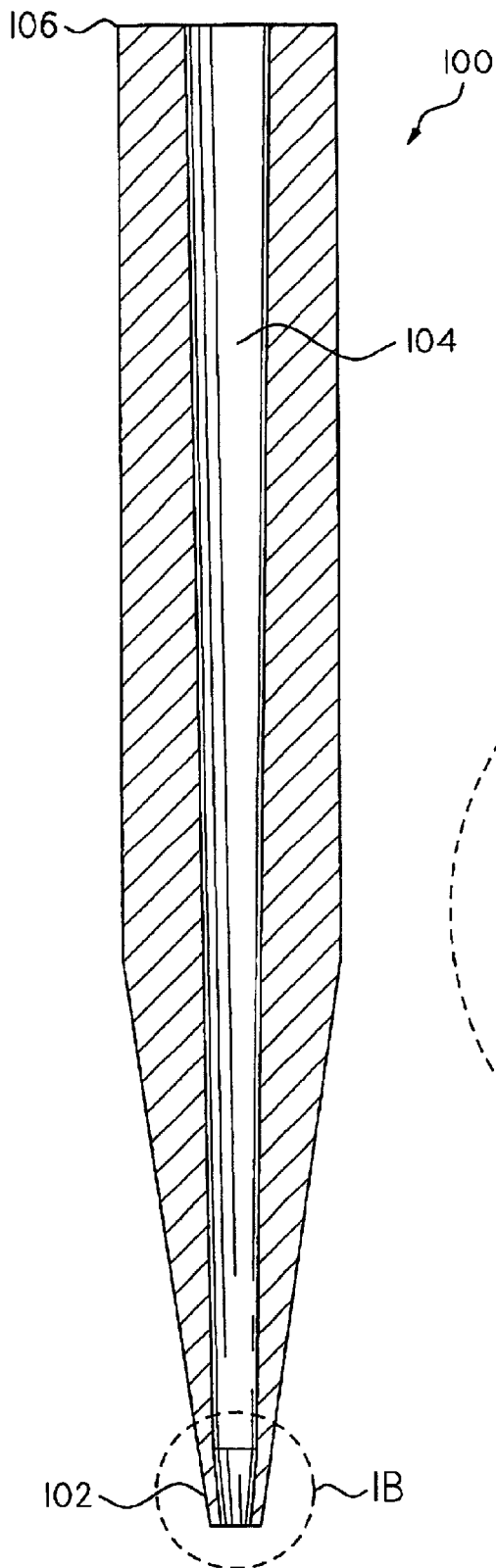
FIG. 1 is a cross sectional view of a conventional bonding tool.
Figure 1B:
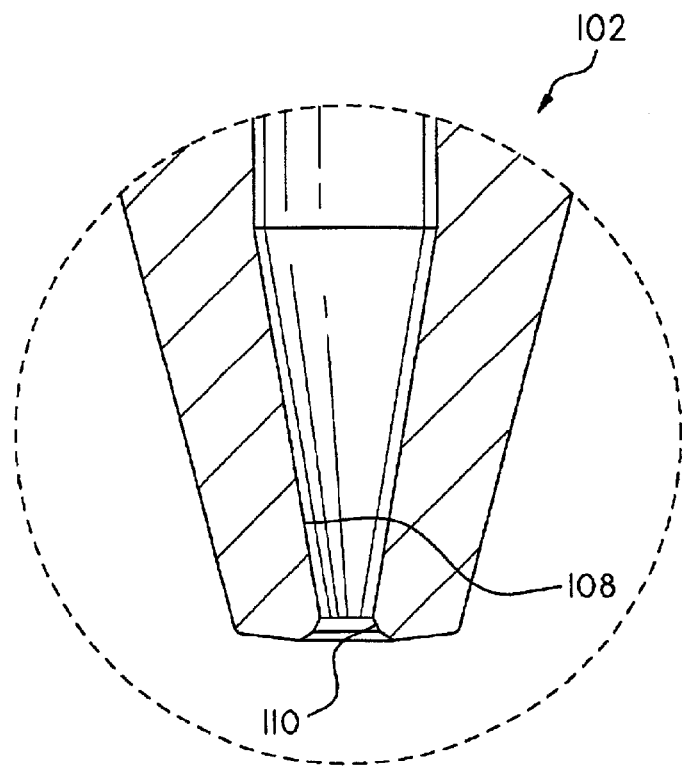

FIG. 1A is a cross sectional view of a conventional bonding tool 100 and FIG. 1B is an enlarged cross sectional view of working tip 102. In FIG. 1A, tool 100 has an orifice 104 that extends from the end 106 of tool 100 to working tip 102. A bonding wire (not shown) is inserted into orifice 104 and exits through working tip 102. As the bonding wire is pulled through orifice 104, it contacts surfaces 108 and 110 (shown in FIG. 1B) depositing contaminants thereon and wears away the unprotected surfaces of tool 100.

Figures 2A, 2B:
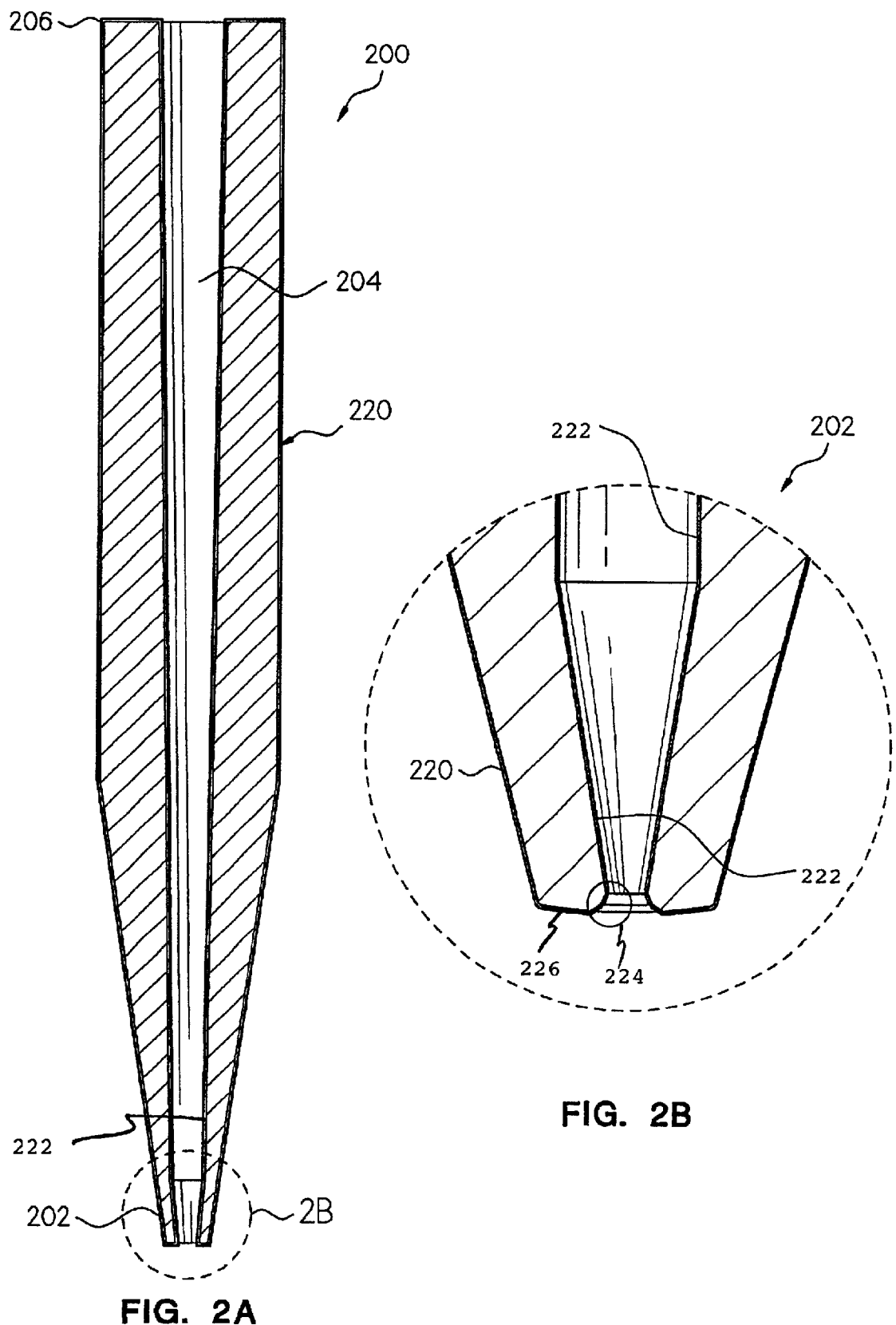
FIGS. 2A–2B are cross sectional views of a bonding tool according to a first exemplary embodiment of the present invention.

FIG. 2A is a cross sectional view of a bonding tool according to a first exemplary embodiment of the present invention. In FIG. 2A, bonding tool 200 has coating 220, 222 deposited on the exterior and interior surfaces, respectively, of bonding tool 200. The coating 220, 222 may be the same or different as discussed in detail below. In an exemplary embodiment, the coating 220, 222 may be a polymer, such as parylene or polycorbofluoro for example. In an exemplary embodiment, the coating may have an average thickness of up to about 2.0 microns. In a preferred embodiment, the thickness of coating 220, 222 is about 0.1 microns. The invention is not so limited, however, in that another thickness of coating 220, 222 may be used based on the particular application. As shown in greater detail in FIG. 2B, coating 220, 222 also protects the surfaces 226, 224, respectively, where the bonding wire (not shown) has the greatest contact. Furthermore, since the polymer coating 220, 222 has an electrical isolation properties, it may also be used as an insulator for conductive capillaries. In addition, the inclusion of a polymer coating 222 on the interior surface of bonding tool 200 may reduce the drag force of the bonding wire as it passes through the bonding tool 200.

Generally, capillaries and bonding tools have a cylindrical shape and are produced by either direct ceramic die pressing followed by sintering or injection molding followed by sintering, and are machined to final shape by grinding or Electro Discharge Machining operations (EDM).

Figure 9:
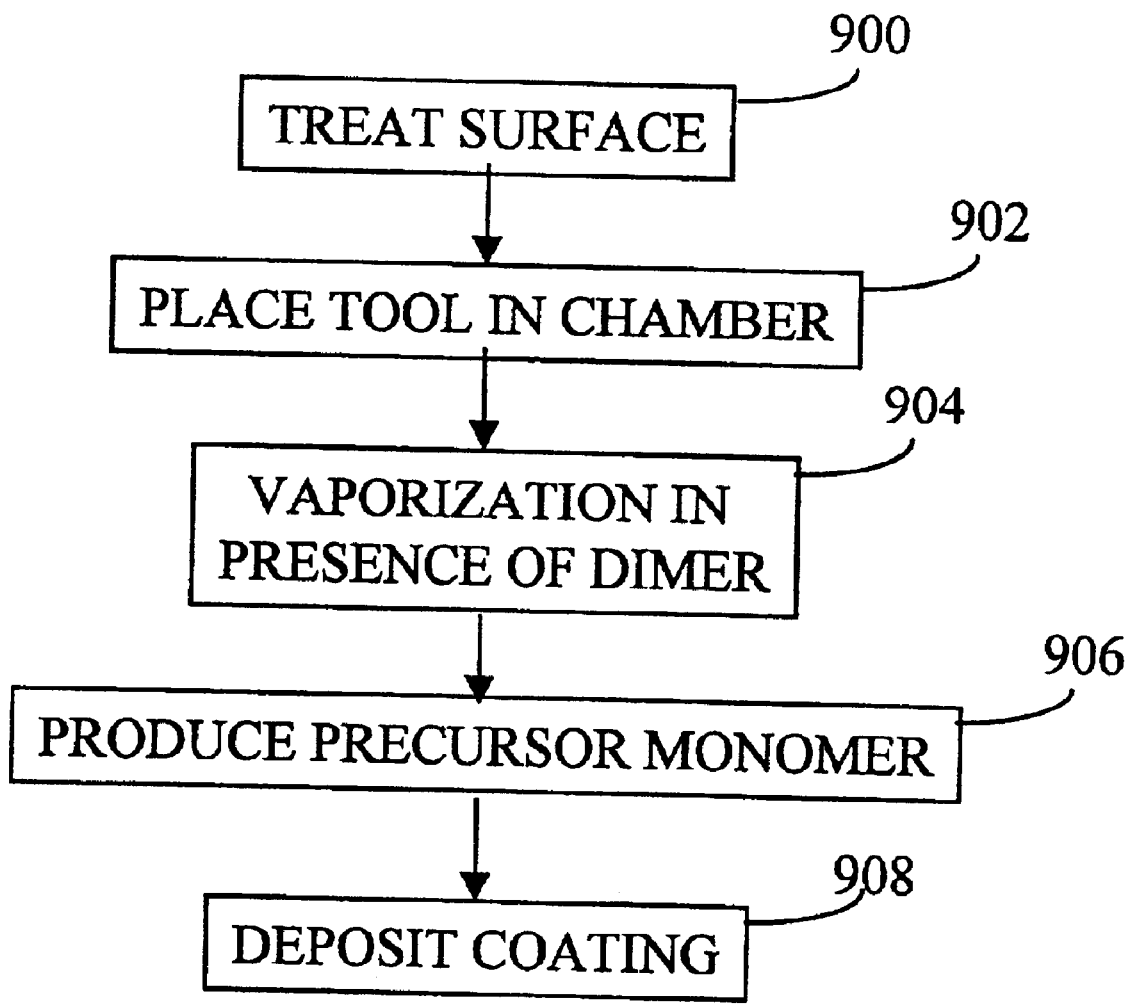
FIG. 9 is a flow chart illustrating a coating process according to an exemplary embodiment of the present invention.

FIG. 9 is a flow chart illustrating the coating process according to the exemplary embodiment of the present invention. At Step 900, the surface of the bonding tool is treated. Exemplary treatments include plasma, heat, and chemical treatments. At Step 902, the treated bonding tool is placed in a vacuum chamber. At Step 904, the tool is subjected to vaporization at about 150° C. and 1.0 torr with a di-Para-Xylylene dimer ([2,2] paracyclophane), for example. At Step, 906, the tool is then subjected to pyrolesis at about 690° and 0.5 torr to produce a precursor monomer of para-xylylene for example. At Step 908, deposition of coating 220, 222 such as Poly-Para-Xylylene for example, is performed at about ambient temperature (25° C. for example) and about 0.1 torr of chamber pressure. This exemplary process deposits a substantially uniform, continuous coating 220, 222 on tool 200 having a thickness of about 0.1 micron. It is understood by those of skill in the art that deposition of the coating may be accomplished by various methods of vapor deposition including chemical vapor deposition (CVD), physical vapor deposition (PVD) and their variants. Additionally, the bonding tool may be coated by immersing the bonding tool in a coating material.

Figures 3A, 3B:
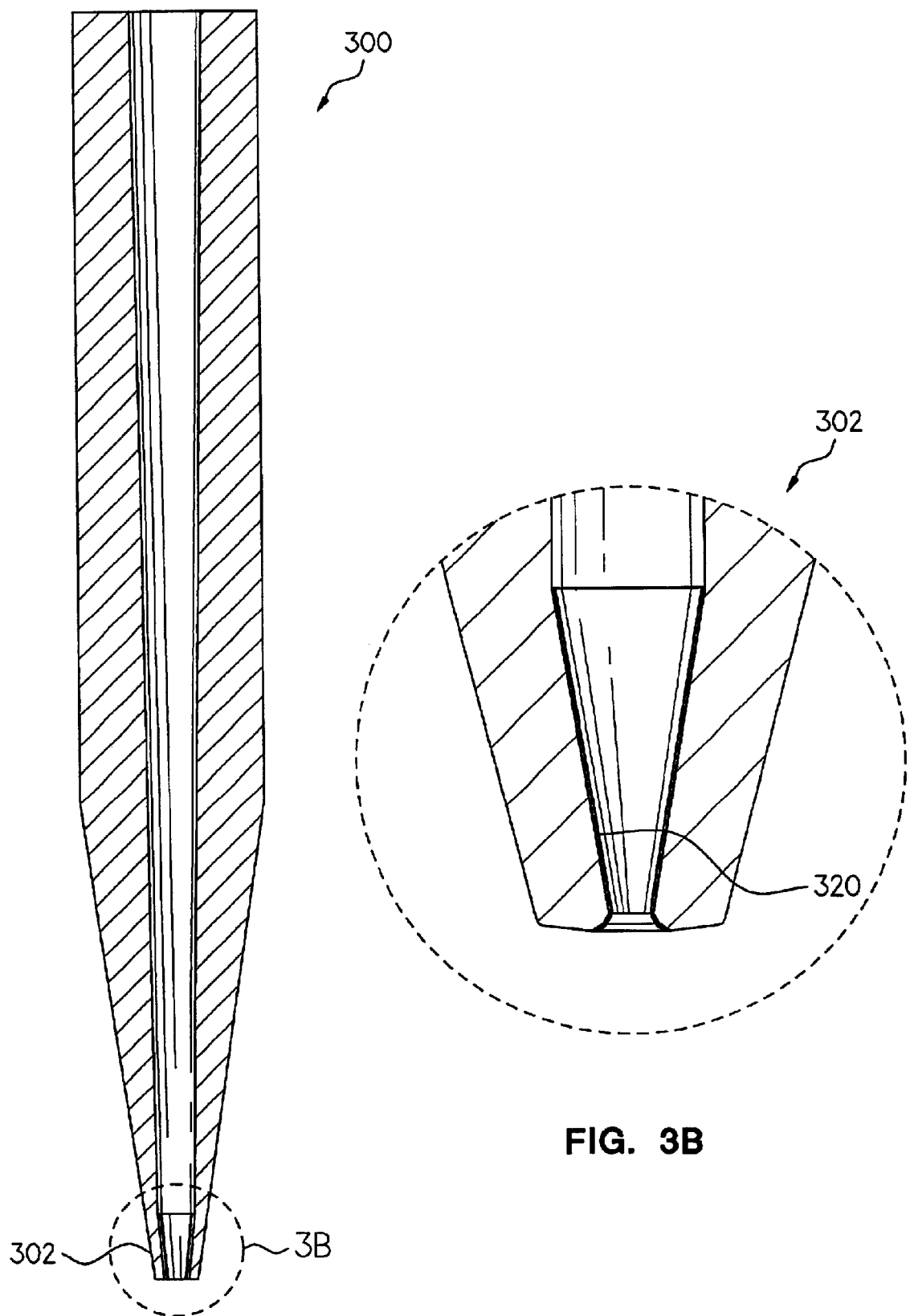
FIGS. 3A–3B are cross sectional views of a bonding tool according to a second exemplary embodiment of the present invention.

FIG. 3A is a cross sectional view of a bonding tool according to a second exemplary embodiment of the present invention. In FIG. 3A, bonding tool 300 has coating 320 deposited on a portion of the interior surface of bonding tool 300. As shown in greater detail in FIG. 3B, coating 320 is placed on the surfaces where the bonding wire (not shown) has the greatest contact. It is also contemplated that the coating may be placed on any combination of interior and/or exterior surfaces of the bonding tool as desired.

It is further contemplated that the coating may be either a soft or hard coating in any combination, such as a hard coating 220 on a exterior of the bonding tool and a soft coating 222 on an interior of the bonding tool, or visa versa. Use of a hard coating 220 on the exterior of the bonding tool 200 may increase the wear resistance of the bonding tool, especially along portion 226, which comes in contact with the surface of the bonding pad (not shown) during the bonding process. Whereas, using a soft coating 222 on the interior surfaces of the bonding tool 200 tends to reduce the drag force of the wire as it passes through the bonding tool. Examples of such hard coatings are Amorphous Alumina and $Si_3N_4$. Examples of such soft coatings may be Polymers (i.e., Polyolefines, Polyparaxylylenes, Floropolymers, etc.).

Figure 4:
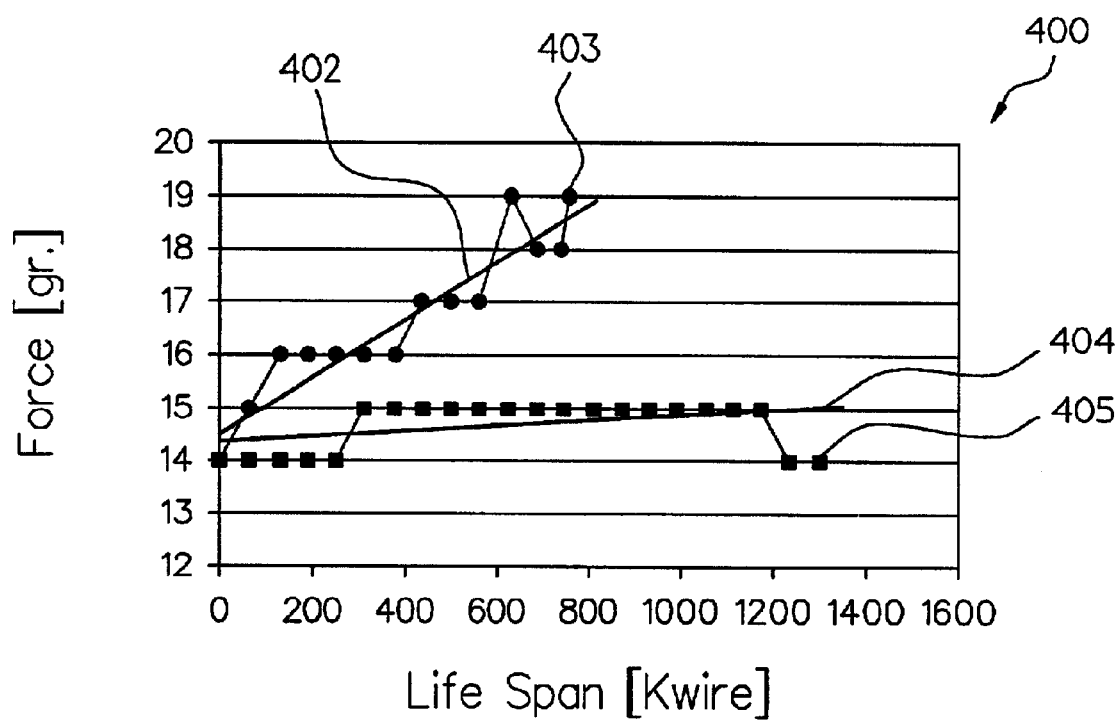
FIG. 4 is a graph plotting the effect the exemplary embodiment of the present invention has on bonding force.

The efficacy of the exemplary polymer coating in improving the reliability and stability of the wire bonding process is illustrated in FIGS. 4–8. Referring to FIG. 4, graph 400 is illustrated. In FIG. 4, graph 400 plots the effect of the polymer coating on the bonding force. In FIG. 4, the ordinate is the life span of the bonding tool with respect to the number of bonded wires and the abscissa is the bonding force required to form the bonds. Plot 402 is a linear representation of points 403 plotted for a conventional bonding tool. As shown, plot 402 increases significantly as the number of bonds increase. Plot 402 also shows that the bonding tool fails (that is, falls outside of the process window discussed above, requiring replacement) after about 800,000 bonds. By contrast, plot 404 is a linear representation of points 405 plotted for a bonding tool according to the present invention. As shown, plot 404 shows a negligible increase in bonding force as the number of bonds increase. Plot 404 also shows that the life of the exemplary bonding tool is almost twice that of the conventional bonding tool.

Figure 5:
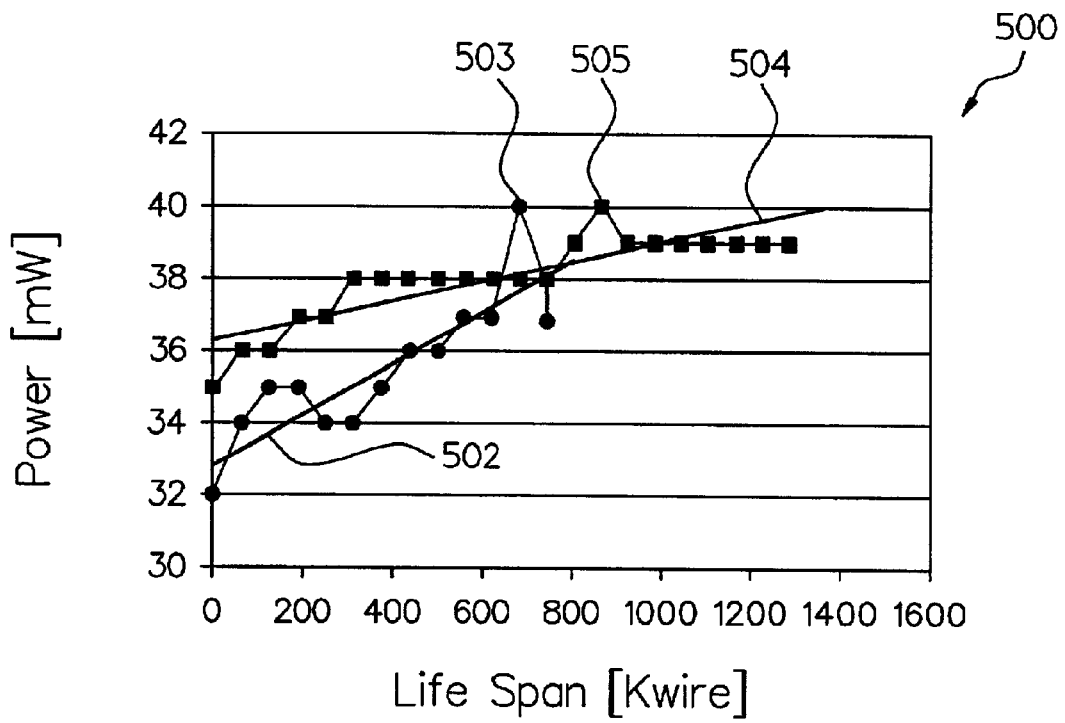
FIG. 5 is a graph plotting the effect the exemplary embodiment of the present invention has on bond power.

In FIG. 5, graph 500 plots the effect of the polymer coating on the bonding power. In FIG. 5, the ordinate is the life span of the bonding tool with respect to the number of bonded wires and the abscissa is the bonding power required to form the bonds. Plot 502 is a linear representation of points 503 plotted for the conventional bonding tool. As shown, plot 502 increased significantly as the number of bonds increase. By contrast, plot 504 is a linear representation of points 505 plotted for a bonding tool according to the present invention. As shown, plot 504 shows a negligible increase in bonding power as the number of bonds increase.

Figure 6:
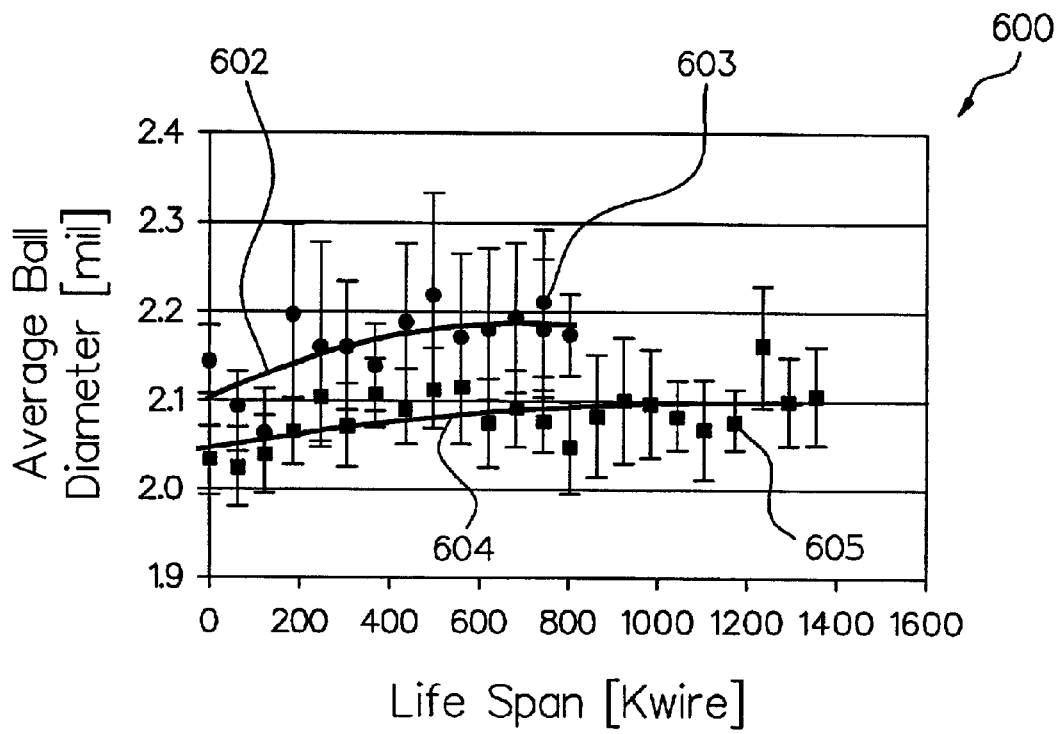
FIG. 6 is a graph plotting the effect the exemplary embodiment of the present invention has on bonding ball size.

In FIG. 6, graph 600 plots the effect of the polymer coating on the bonding ball size. In FIG. 6, the ordinate is the life span of the bonding tool with respect to the number of bonded wires and the abscissa is the average bonding ball diameter. Plot 602 is a linear representation of points 603 plotted for a conventional bonding tool and plot 604 is a linear representation of points 605 plotted for a bonding tool according to the present invention. As shown, not only is the average ball diameter for the conventional bonding tool initially greater that that of the exemplary bonding tool, the rate of increase in average diameter is greater that the exemplary tool. This increased diameter may effect the bonding process as the density requirements of the industry increase.

Figure 7:
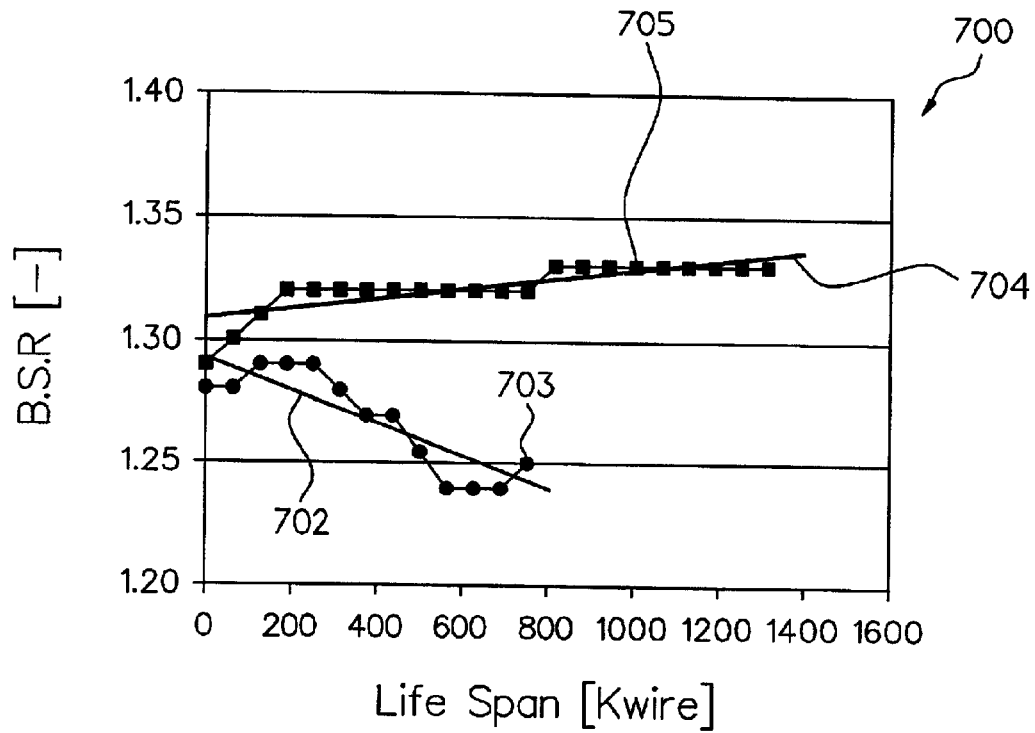
FIG. 7 is a graph plotting the effect the exemplary embodiment of the present invention has on bonding ball size ratio.

In FIG. 7, graph 700 plots the effect of the polymer coating on the bonding ball size ratio. In FIG. 7, the ordinate is the life span of the bonding tool with respect to the number of bonded wires and the abscissa is the bonding ball size ratio. Plot 702 is a linear representation of points 703 plotted for the conventional bonding tool. As shown, plot 702 decreases significantly as the number of bonds increase. By contrast, plot 704 is a linear representation of points 705 plotted for a bonding tool according to the present invention. As shown, plot 704 shows a negligible change in the ball size ratio as the number of bonds increase. Thus, by using the exemplary bonding tool, greater uniformity of bonding balls may be achieved.

Figure 8:
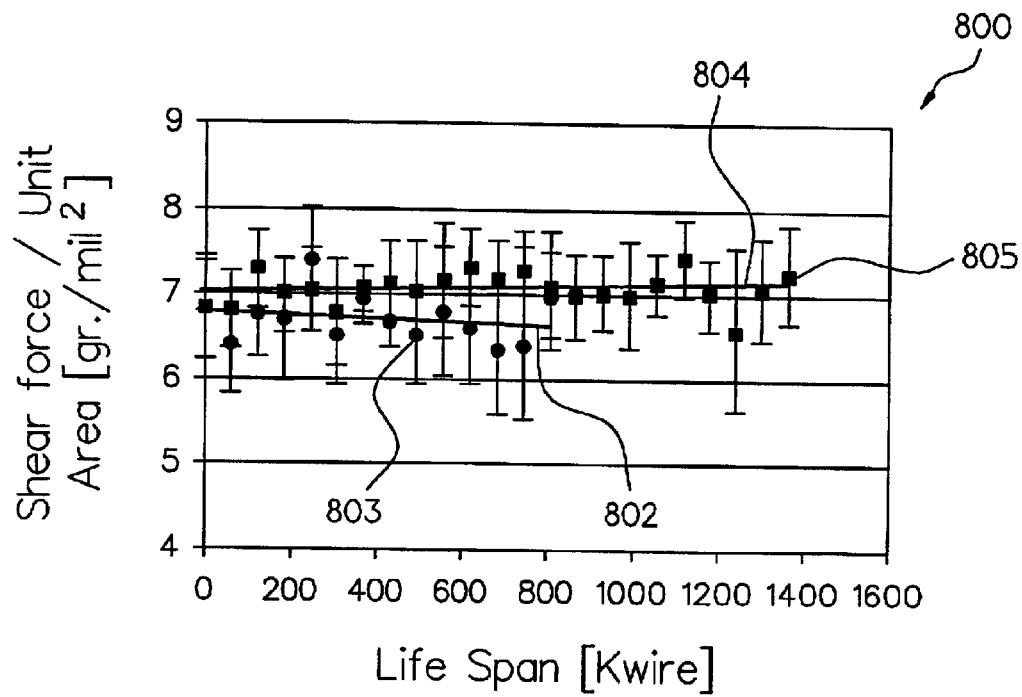
FIG. 8 is a graph plotting the effect the exemplary embodiment of the present invention has on bond performance (i.e., shear force/unit area)

In FIG. 8, graph 800 plots the effect of the polymer coating on the shear force per unit area required to break a bond. In FIG. 8, the ordinate is the life span of the bonding tool with respect to the number of bonded wires and the abscissa is the shear force. Plot 802 is a linear representation of points 803 plotted for the conventional bonding tool. As shown, plot 802 decrease as the number of bonds increase, thereby indicating that the bonds become weaker as the bonding tool is used. By contrast, plot 804 is a linear representation of points 805 plotted for a bonding tool according to the present invention. As shown, plot 804 shows a sight increase in shear force required to break a bond as the number of bonds increase.

Although the invention has been described with reference to exemplary embodiments, it is not limited thereto. Rather, the appended claims should be construed to include other variants and embodiments of the invention which may be made by those skilled in the art without departing from the true spirit and scope of the present invention.

What is claimed:

1. A bonding tool for bonding a wire to a substrate, the bonding tool having a body and a working tip coupled to one end of the body, and comprising:

an orifice extending along a longitudinal axis of the body and the working tip and having a conical portion adjacent the working tip; and a polymer coating disposed over at least a portion of a non-polymeric surface of the conical portion of the orifice.

2. A capillary bonding tool according to claim 1, wherein the coating extends along an entire length of the orifice.

3. A capillary bonding tool according to claim 2, wherein the coating is applied to at least a portion of an exterior surface of the working tip.

4. A capillary bonding tool according to claim 1, wherein the coating is disposed over at least a portion of an exterior surface of the working tip.

5. A capillary bonding tool according to claim 1, wherein the coating is disposed over an exterior surface of the working tip and the body.

6. A capillary bonding tool according to claim 1, wherein the coating is at least one of i) a polymer, ii) an Alumina, iii) $Si_3N_4$, iv) silica, v) a combination of 12% silica and 88% Alumina, and vi a Diamond like carbon (DLC).

7. A bonding tool for bonding a wire to a substrate, the bonding tool having a body and a working tip coupled to one end of the body, and comprising:

an orifice extending along a longitudinal axis of the body and the working tip and having a conical portion adjacent the working tip; and a coating disposed over at least a portion of a non-polymeric surface of the conical portion of the orifice, wherein the coating is a polymer disposed along an interior surface of the orifice and one of i) an Alumina, ii) $Si_3N_4$, iii) silica, iv) a combination of 12% silica and 88% Alumina, and v) a Diamond like coating (DLC) disposed along an exterior portion of the orifice.

8. A capillary bonding tool according to claim 1, wherein the coating has a substantially uniform thickness.

9. A bonding tool for bonding a wire to a substrate, the bonding tool having a body and a working tip coupled to one end of the body, and comprising:

an orifice extending along a longitudinal axis of the body and the working tip and having a conical portion adjacent the working tip; and a polymer coating disposed over at least a portion of a non-polymeric surface of the conical portion of the orifice, wherein the coating has a substantially uniform thickness of up to about 2.0 microns.

10. A capillary bonding tool according to claim 1, wherein the body of the bonding tool has a substantially cylindrical shape.

11. A capillary bonding tool according to claim 1, wherein the coating is one of polyolefine and parylene.

12. A capillary bonding tool according to claim 1, wherein the coating is formed by vapor phase deposition.

13. A capillary bonding tool according to claim 1, wherein the coating is formed by one of chemical vapor deposition and physical vapor deposition.

14. A capillary bonding tool according to claim 1, wherein the coating is formed by immersing the bonding tool in a coating material.

15. A bonding tool for bonding a wire to a substrate, the bonding tool having a body and a working tip coupled to one end of the body, and comprising:

an orifice extending along a longitudinal axis of the body and the working tip and having a conical portion adjacent the working tip; and a polymer non-conductive coating disposed over at least a portion of a non-polymeric surface of the conical portion of the orifice.

* * * * *